US006573753B1

(12) United States Patent
Snyder

(10) Patent No.: US 6,573,753 B1
(45) Date of Patent: Jun. 3, 2003

(54) MICROCONTROLLER INPUT/OUTPUT NODES WITH BOTH PROGRAMMABLE PULL-UP AND PULL-DOWN RESISTIVE LOADS AND PROGRAMMABLE DRIVE STRENGTH

(75) Inventor: Warren Snyder, Snohomish, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/909,527

(22) Filed: Jul. 20, 2001

(51) Int. Cl.[7] ............................................. H03K 17/16
(52) U.S. Cl. ........................ 326/87; 326/81; 326/83; 326/85; 327/108; 327/170
(58) Field of Search ............................. 326/81, 83, 85, 326/87; 327/108, 170

(56) References Cited

U.S. PATENT DOCUMENTS

| 4,697,107 A | * | 9/1987 | Haines ........................ 307/474 |
| 5,202,687 A |   | 4/1993 | Distinti ........................ 341/158 |
| 5,739,707 A | * | 4/1998 | Barraclough ................ 327/112 |
| 6,144,327 A |   | 11/2000 | Distinti et al. .............. 341/126 |
| 6,281,709 B1 | * | 8/2001 | Seyyedy ........................ 326/87 |
| 6,288,563 B1 | * | 9/2001 | Muljono et al. ............... 326/27 |
| 6,300,806 B1 | * | 10/2001 | Theus et al. ................. 327/112 |
| 6,320,433 B1 | * | 11/2001 | Hinterscher ................. 327/112 |

* cited by examiner

*Primary Examiner*—Michael Tokar
*Assistant Examiner*—Vibol Tan
(74) *Attorney, Agent, or Firm*—Wagner, Murabito & Hao LLP

(57) ABSTRACT

The present invention relates to an input/output node in an electronic device which comprises an input/output pin, a plurality of programmable pull-up resistors and a plurality of programmable pull-down resistors. Each of the pull-up and pull-down resistors, or a combination of them, can be activated by turning on or off n-MOS and p-MOS transistors with logic contained in a mode register. The pull-up and pull-down resistance can be implemented by the inclusion of a resistor in series or by utilization of the innate resistance of the MOS-FET transistor, itself. The resistances can be strong, medium, or weak, depending on the needs of the circuitry. One advantage of such control over drive strength is the ability to transmit or receive data in virtually any electronic environment. Another advantage is the ability to reduce voltage ramp-rates, which reduces high frequency harmonics and the attendant electromagnetic interference.

31 Claims, 3 Drawing Sheets

MICROCONTROLLER INPUT/OUTPUT NODES WITH BOTH PROGRAMMABLE PULL-UP AND PULL-DOWN RESISTIVE LOADS AND PROGRAMMABLE DRIVE STRENGTH

FIELD OF THE INVENTION

The present invention relates to the field of microcontrollers and similar electronic devices.

BACKGROUND OF THE INVENTION

Modern microcontrollers are found in nearly every facet of modern life. Tasks once accomplished by hand are now not only electrified but done with "smart" machines. Every electric shaver, hedge trimmer, weed cutter, automotive instrument panel, home laundry, light switch, clock radio, microwave oven, ad infinitum, has a built in microcontroller. Microcontrollers work in every conceivable condition, including temperature extremes, wet and dry conditions, and other hostile environments. They also are called upon to operate in hostile electrical environments; attempting to read data on noisy pins and transmitting data into adverse voltages.

Overcoming hostile physical environments has been accomplished in different ways by different designs. Overcoming hostile electrical environments, however, primarily involves controlling the drive strength of a microcontroller's input and output (I/O) nodes.

Numerous ways have been developed to control drive strength. Typically, the methods involve pulling an I/O node's voltage up, to device supply voltage, or down, to ground. This is most often accomplished through resistors tied to the node and to either ground or supply voltage. In some instances, a pull-up resistor or a pull-down resistor can be selected by a data bit in order to turn on or turn off the resistor's function. However, there are many instances when a simple on/off selection is insufficient to meet the needs of a dynamic environment. A changing voltage on an output pin can require a range of different drive strengths at different times. there are times when the pin environment is such that transmitting a data bit will require a voltage ramp-rate that produces high frequency harmonics unless the pin is pulled down, but only slightly.

What is needed, then, is a means of controlling the drive strength of an input/output pin with sufficient resolution to meet most foreseeable electronic environments in which an I/O pin will need to operate. Furthermore, the means must achieve necessary drive strengths on the fly, sometimes changing between successive data bits. The means by which all this is accomplished must also be manufacturable in current manufacturing methods and fit in existing device footprints.

SUMMARY OF THE INVENTION

Presented herein is a method for controlling the drive strength of an input/output node in a microcontroller. The means by which the drive strength is controlled attains sufficient resolution to meet most foreseeable electronic environments in which an I/O pin will need to operate. Furthermore, the means achieves necessary drive strengths on the fly, and is capable of changing between successive data bits. All of this is accomplished by elements that are manufacturable by current manufacturing methods and fit in existing device footprints The present invention relates to an input/output node in an electronic device which comprises an input/output pin, a plurality of programmable pull-up resistors and a plurality of programmable pull-down resistors. Each of the pull-up and pull-down resistors, or a combination of them, can be activated by turning on or off n-MOS and p-MOS transistors with logic contained in a mode register. The pull-up and pull-down resistance can be implemented by the inclusion of a resistor in series or by utilization of the innate resistance of the MOS-FET transistor, itself. The resistances can be strong, medium, or weak, depending on the needs of the circuitry. One advantage of such control over drive strength is the ability to transmit or receive data in virtually any electronic environment. Another advantage is the ability to reduce voltage ramp-rates, which reduces high frequency harmonics and the attendant electromagnetic interference.

Embodiments of the present invention include an input/output node on an electronic device which comprises an input/output pin, a plurality of pull-up resistors selectively removable from the pin and a plurality of pull-down resistors selectively removable from the pin, wherein, the pull-up resistors and the pull-down resistors can be selected for activation by logic.

BRIEF DESCRIPTION OF THE DRAWING

The operation and components of this invention can be best visualized by reference to the drawing.

SPECIFICATION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

DETAILED DESCRIPTION

The embodiments of the present invention discussed herein relate to the pin electronics on the input and output pins of an electronic device, in particular, a microcontroller. Modern integrated circuit devices are typically very small and work in environments having very small voltages. In some cases, modern digital devices can differentiate between a logical 1 and a logical 0 with voltage differences smaller than one volt. The currents carried in these devices are miniscule and communication with the other devices requires careful drive strength control. I/O pin voltages and currents are driven in order to properly read logical input from other devices and to produce a desired output logic level in the face of an electronically busy outside world.

Figure 1:
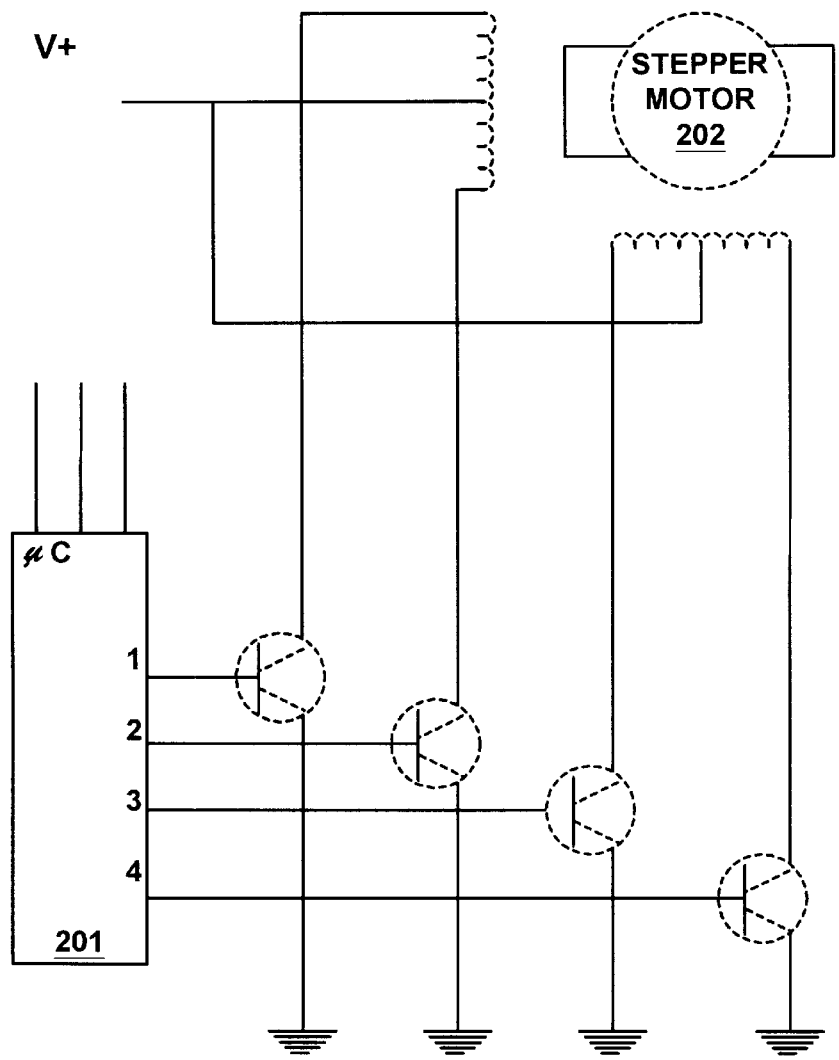
FIG. 1 illustrates a microcontroller in a typical installation consistent with embodiments of the present invention.

The embodiments of the present invention discussed here may be best understood with reference to the figures. FIG. 1 illustrates a typical use of a microcontroller in an electrically hostile environment. Microcontroller ($\mu$C) 201 is shown in a control circuit with stepper motor 202. Stepper motors and some other types of inductive loads produce dynamic environments in that the relationship of permanent magnets, motion and induction cause continual changes in the electrical environment of each data output. Although the microcontroller in FIG. 1 is isolated somewhat by the use of NPN transistors on the motor coils, the duration requirements and changes in current flow when a motor is in motion demand a controllable current output from the microcontroller output pin.

This embodiment of the present invention presents a novel way to achieve a very precise control over I/O pin voltage and current using a combination of pull-up and pull-down resistors that can be selected by logic. This embodiment is implemented on each pin of a microcontroller, however, the concept of combining programmable pull-up and pull-down resistors on an I/O pin is applicable to a very wide variety of electronic devices.

Figure 2:
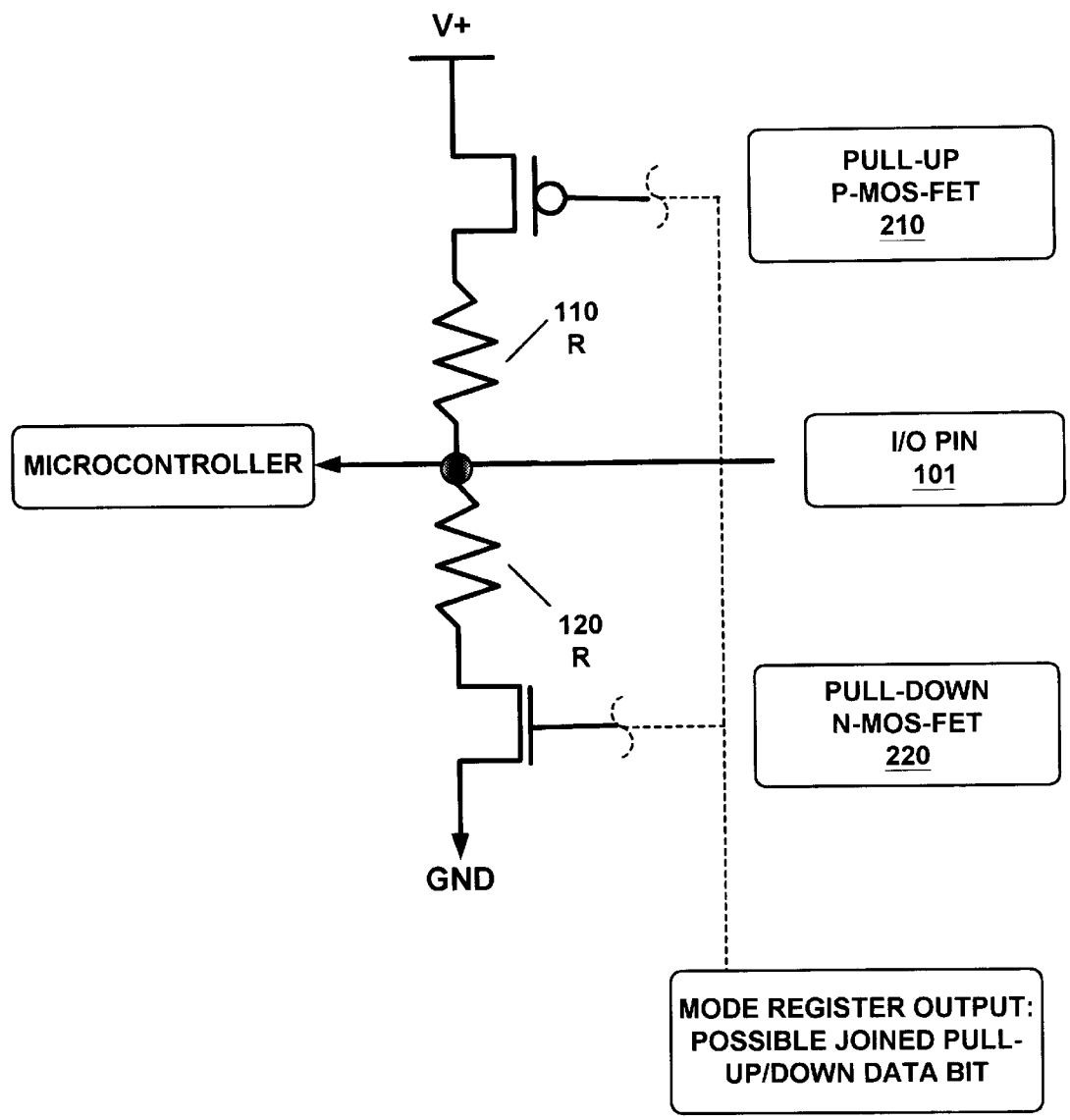
FIG. 2 illustrates a data-selectable pull-up/pull-down resistor pair consistent with embodiments of the present invention.

FIG. 2 illustrates a generic I/O pin, 101, with a selectable pull-up resistor 110 and a selectable pull-down resistor 120. Pull-up resistor 110 is selected by p-MOS device 210 and pull-down resistor 120 is selected by n-MOS device 220. Notice, in the generic embodiment shown in FIG. 2, that the gate inputs of MOS devices 210 and 220 are activated with opposite polarity. In essence this means that the two gate inputs could be ganged together in some implementations and could be selected by a single data bit. In the actual implementation shown, a high on a joined gate input would select a voltage pull-up on the I/O pin via pull-up resistor 110 and a low would select a voltage pull-down via resistor 120. If the gate inputs were not joined and there were different values selected for the resistors, various combinations of pull-up/pull-down strengths could be achieved and selected by logic. The logic, in the form of gate voltages on the MOS devices could be generated by internal logic or by programming and the values could be held in a mode register associated with the I/O pin. Generally, it is noted, source/drain current in a field-effect transistor (FET) is inversely proportional to the gate voltage in an N device and proportional in a P device. This means that varying strengths of pull-up and pull-down could be attained in a single pairing of devices. However, in integrated circuit design, it is not likely to be cost effective to implement the circuitry to control a single device or pair to that degree.

The embodiment of the present invention discussed here is envisioned as an array of six switch-able MOS-FET pull-up an pull-down resistors connected to an I/O pin; three pull-ups and three pull-downs. The arrangement is envisioned as three pull-up devices, of three different strength levels, tying the pin to-supply voltage and three pull-down devices, also of three different strengths tying the pin to ground. In actual implementation, it is likely that the inherent resistance of "switched-on" MOS-FET devices will be employed at some strength levels. For example, one common implementation of a FET designed into integrated circuits has an inherent resistance of 100 ohms. Since one envisioned value selection is 5 k ohms, 100 ohms and 10 ohms, which are weak medium and strong levels, respectively, there would need be no additional resistor designed into pin electronics for the 100 ohm pull-up and pull-down. The same holds true for values near 10 ohms. However, a value selection near 5 k ohms may require an additional resistor designed into the device, as is shown in FIGS. 2 and 3.

Figure 3:
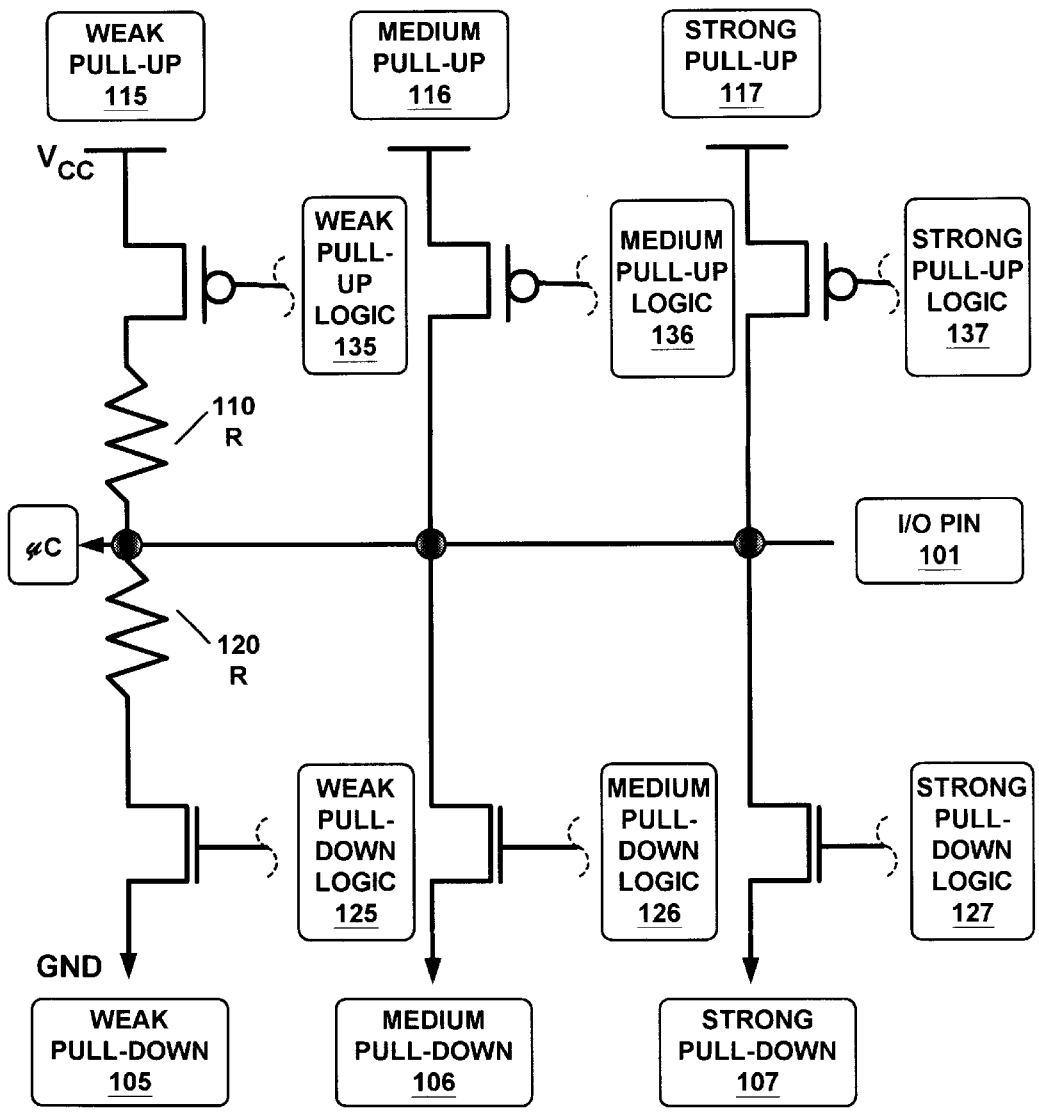
FIG. 3 illustrates an input/output node in a microcontroller with programmable pull-up and pull-down resistors, consistent with embodiments of the present invention.

FIG. 3 illustrates a likely embodiment of the present invention. It is envisioned that this embodiment would be implemented as an array of three MOS (metal-oxide, silicon) devices controlling the "switching on" or Switching off" of three values of resistance to supply voltage ($V_{cc}$), the pull-up side. A similar array of three MOS-FETs would control connection to ground, the pull-down side. An extra bit of circuitry would be used to select which MOS device, or combination of devices, is turned on based on a single data word. The data word could be very small, in some implementations as small as two data bits. This would be in the implementation where the highest value resistors (weakest pull) were always on and only the medium and strong pull values would be switched on or off. The controlling data word, whatever its length, would be held in a mode register of sufficient size. A third data bit used would be the selection of output, either a logical 1 or logical 0. In receptive mode, the pin would be weakly driven to whatever state required that would allow it to be overridden by incoming data, i.e. a voltage on the pin, not requested by internal circuitry, that would indicate data.

The concepts presented in this embodiment of the present invention may best be understood by reference still to FIG. 3. FIG. 3 illustrates pin electronics in accordance with the embodiment of the present invention discussed here. Input/output pin 101 is common to all six pull-up and pull-down resistors. P-MOS FETs 115, 116 and 117 and the weak, medium and strong pull-up "switches", respectively. To achieve a weak pull-up, device 115 requires additional resistor 110 achieve approximately 5 k ohms in this embodiment. Switches 115, 116 and 117 tie the pin to supply voltage in this embodiment, but some other voltage may be used in others. N-MOS FETs 105, 106 and 107 are the weak, medium and strong pull-down switches. Again, the weak pull-down, like the weak pull-up, is achieved with a relatively large resistance supplied by the addition of a 5 k ohms resistor.

The gates to the switching FETs in this embodiment of the present invention are selected by mode register and data resister logic. To achieve a high voltage state with strong current capability, FET 117's gate 137 would be turned on. Since the inherent resistance of FET 117 is low, relatively large current flows would be available. To achieve a high voltage with a low current flow capability, FET 115's gate 135 could be turned on. At a resistance of approximately 5 k ohms, the current capability of 115 would be very weak.

Though not done in this embodiment, it is envisioned that very finite control of pin state could be achieved by turning on different combinations of pull-up and pull-down devices. For example, if there were two strong pull-down devices of 10 ohms, tuning on both of them would result in a resistance of 5 ohms, achieving somewhat of an ultra-strong pull-down. Whatever the actual implementation, the concept presented herein is the combination of programmable pull-up and programmable pull-down resistors on the same I/O pin.

As was discussed earlier, it is conceivable that the gate inputs to each pull-up/pull-down strength pairing could be joined. If that were the case, a demultiplexer could send the proper high or low data signal to the gate inputs based on a data word held in a two-bit mode register. Such a register could be included in each I/O pin's pin-electronics suite without too much additional impact on IC design.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. An input/output node on an electronic device, comprising:
   an input/output pin;
   a plurality of reconfigurably selectable pull-up resistors coupled to said pin; and,
   a plurality of reconfigurably selectable pull-down resistors coupled to said pin,
   wherein, said pull-up resistors and said pull-down resistors are reconfigurably selectable for activation by logic; and
   wherein drive strength in said input/output node is controlled by selection of said pull-down resistors-and said pull up resistors.

2. The input/output node described in claim 1, wherein said electronic device is a microcontroller.

3. The input/output node described in claim 1, wherein said pull-down resistors are implemented as n-MOS devices.

4. The input/output node described in claim 1, wherein said pull-up resistors are implemented as p-MOS devices.

5. The input/output node described in claim 1, wherein said pull-down resistors are selected for activation by logic in a mode register.

6. The input/output node described in claim 1, wherein said pull-up resistors are selected for activation by logic in a mode register.

7. An input/output node on an electronic device, comprising:
   an input/output pin;
   a plurality of reconfigurably selectable pull-up resistors coupled to said pin; and,
   a plurality of reconfigurably selectable pull-down resistors coupled to said pin,
   wherein, said pull-up resistors and said pull-down resistors are reconfigurably selectable for activation by logic; and
   wherein said pull-down resistors are selected for activation by logic in a mode register.

8. The input/output node described in claim 7, wherein said electronic device is a microcontroller.

9. The input/output node described in claim 5, wherein said pull-up down resistors are implemented as n-MOS devices.

10. An input/output node on an electronic device, comprising:
    an input/output pin;
    a plurality of reconfigurably selectable pull-up resistors coupled to said pin; and,
    a plurality of reconfigurably selectable pull-down resistors coupled to said pin,
    wherein, said pull-up resistors and said pull-down resistors are reconfigurably selectable for activation by logic; and
    wherein said pull-up resistors are selected for activation by logic in a mode register.

11. The input/output node described in claim 10, wherein said electronic device is a microcontroller.

12. The input/output node described in claim 10, wherein said pull-up resistors are implemented as p-MOS devices.

13. An electronic device, comprising:
    one or more input/output nodes;
    electronic circuitry, requiring communication via said input/output nodes and electronically coupled to said input/output nodes; and,
    reconfigurably programmable circuitry, electronically coupled to each of said input/output nodes; wherein said reconfigurably programmable circuitry is enabled to control the drive strength of said input/output nodes.

14. The electronic device described in claim 13, wherein said electronic device is a microcontroller.

15. The electronic device described in claim 13, wherein said programmable circuitry comprises pull-up and pull-down resistors reconfigurably selectable by logic.

16. The electronic device described in claim 15, wherein said pull-up and pull-down resistors are selected by logic in a mode register.

17. The electronic device described in claim 13, wherein said drive strength is controlled to reduce electromagnetic interference.

18. In an input/output node of an electronic device, a method for communicating data with a controlled drive strength, comprising the steps of:
    a) selecting a combination of electronically reconfigurable pull-up and pull-down resistors electronically coupled to said input/output node based on drive strength requirements of an electronic device;
    b) commanding the activation of said pull-up and pull-down resistors; and,
    c) communicating data via said input/output node.

19. The method described in claim 18, wherein said step of commanding the activation of said-pull-up and pull-down resistors is effected by logic.

20. The method described in claim 18, wherein said drive strength is controlled in order to reduce electromagnetic interference.

21. The method described in claim 18, wherein said drive strength is controlled in order to ensure compatibility of said electronic device with outside electronic circuitry.

22. The method described in claim 18, wherein said step of communicating data comprises receiving one or more data bits.

23. The method described in claim 18, wherein said step of communicating data comprises transmitting one or more data bits.

24. In an input/output node of an electronic device, a method for communicating data with a controlled drive strength, comprising the step of:
    a) selecting a combination of pull-up and pull-down resistors electronically coupled to said input/output node;
    b) commanding the activation of said pull-up and pull-down resistors; and,
    c) communicating data via said input/output node wherein said drive strength is controlled in order to reduce electromagnetic interference.

25. The method described in claim 24, wherein said step of commanding the activation of said pull-up and pull-down resistors is effected by logic.

26. In an input/output node of an electronic device, a method for communicating data with a controlled drive strength, comprising the steps of:
   a) selecting a combination of pull-up and pull-down resistors electronically coupled to said input/output node;
   b) commanding the activation of said pull-up and pull-down resistors; and,
   c) communicating data via said input/output node wherein said drive strength is controlled in order to ensure compatibility of said electronic device with outside electronic circuitry.

27. The method described in claim 26, wherein said step of commanding the activation of said pull-up and pull-down resistors is effected by logic.

28. In an input/output node of an electronic device, a method for communicating data with a controlled drive strength, comprising the steps of:
   a) selecting a combination of pull-up and pull-down resistors electronically coupled to said input/output node;
   b) commanding the activation of said pull-up and pull-down resistors; and,
   c) communicating data via said input/output node by receiving one or more data bits.

29. The method described in claim 28, wherein said step of commanding the activation of said pull-up and pull-down resistors is effected by logic.

30. In an input/output node of an electronic device, a method for communicating data with a controlled drive strength, comprising the steps of:
   a) selecting a combination of pull-up and pull-down resistors electronically coupled to said input/output node;
   b) commanding the activation of said pull-up and pull-down resistors; and,
   c) communicating data via said input/output node by transmitting one or more data bits.

31. The method described in claim 30, wherein said step of commanding the activation of said pull-up and pull-down resistors is effected by logic.

\* \* \* \* \*